(12) United States Patent
Guenther

(10) Patent No.: US 6,885,150 B2
(45) Date of Patent: Apr. 26, 2005

(54) STRUCTURED ELECTRODES

(75) Inventor: Ewald Guenther, Singapore (SG)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/850,799

(22) Filed: May 21, 2004

(65) Prior Publication Data

US 2004/0212298 A1 Oct. 28, 2004

Related U.S. Application Data

(63) Continuation of application No. 09/737,656, filed on Dec. 18, 2000, which is a continuation of application No. PCT/DE99/01655, filed on Jun. 7, 1999.

(30) Foreign Application Priority Data

Jun. 18, 1998 (DE) ........................................ 198 27 224

(51) Int. Cl.[7] .............................................. H05B 33/00
(52) U.S. Cl. ........................ 313/506; 313/504; 313/498
(58) Field of Search ................................ 313/504–506, 313/498

(56) References Cited

U.S. PATENT DOCUMENTS

| | | | |
|---|---|---|---|
| 3,873,313 A | 3/1975 | Horst et al. |
| 4,256,816 A | 3/1981 | Dunkleberger |
| 4,356,429 A | 10/1982 | Tang |
| 4,659,650 A | 4/1987 | Moritz et al. |
| 5,185,055 A | 2/1993 | Temple et al. |
| 5,247,190 A | 9/1993 | Friend et al. |
| 5,277,749 A | 1/1994 | Griffith et al. |
| 5,360,698 A | 11/1994 | Hanrahan |
| 5,408,742 A | 4/1995 | Zaidel et al. |
| 5,953,587 A | 9/1999 | Forrest et al. |
| 6,013,538 A | 1/2000 | Burrows et al. |
| 6,015,652 A | 1/2000 | Ahlquist et al. |
| 6,351,066 B1 | 2/2002 | Gyoutoku et al. |
| 6,582,888 B1 * | 6/2003 | Herbst et al. ................ 430/312 |
| 2002/0014836 A1 | 2/2002 | Codama et al. |

FOREIGN PATENT DOCUMENTS

| | | |
|---|---|---|
| DE | 4401590 A1 | 7/1995 |
| EP | 0269219 A2 | 6/1988 |
| EP | 0341843 A2 | 11/1989 |
| EP | 0732868 A1 | 9/1996 |
| EP | 0910 128 A2 | 4/1999 |
| JP | 02253263 A | 10/1990 |
| JP | 8315981 | 9/1996 |
| JP | 9330792 | 12/1997 |
| JP | 10106747 | 4/1998 |

OTHER PUBLICATIONS

Mohondro, R. et al., "Photostabilization: The Process of Improvement", Future Fav International, pp. 235–247, 1997 no month.

* cited by examiner

*Primary Examiner*—Joseph Williams
(74) *Attorney, Agent, or Firm*—Fish & Richardson P.C.

(57) ABSTRACT

The present invention relates to an apparatus with electroluminescent components having one or more layers of organic active material. The electrodes are structured in such a way that the apparatus's layers are protected during structuring and the components may be tightly packed together to improve display resolution. The display includes two electrode layers in addition to the at least one organic layer. The display also includes a first layer and a second layer that form a structure with an overhang. The overhang prevents at least two electrodes from one of the electrode layers from contacting one another. The second layer includes a cross-linked material.

22 Claims, 1 Drawing Sheet

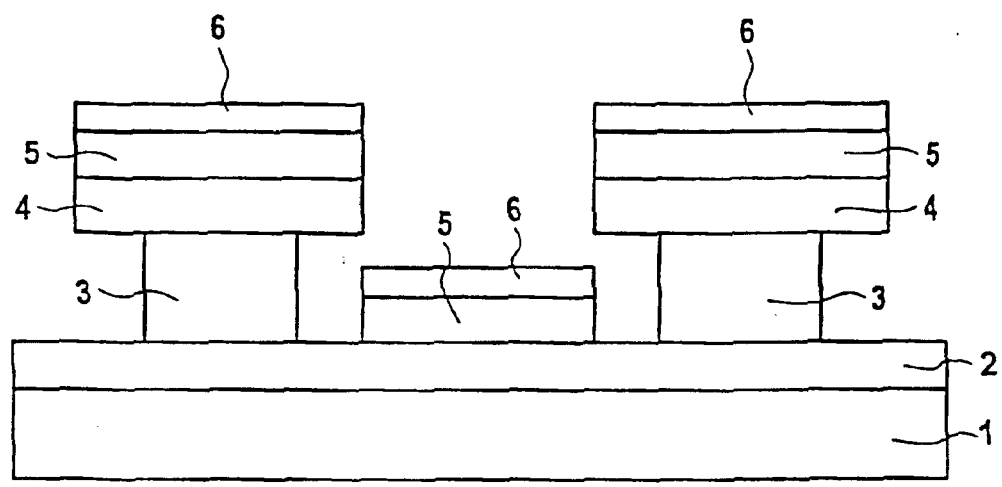
FIG_1

STRUCTURED ELECTRODES

CROSS-REFERENCE TO RELATED APPLICATIONS

This application is a continuation (and claims the benefit of priority under 35 USC 120) of U.S. application Ser. No. 09/737,656, filed Dec. 18, 2000, which is a continuation of International Application Serial No. PCT/DE99/01655, filed Jun. 7, 1999, which designates the United States, which claims priority to German Application Serial No. 19827224.3, filed Jun. 18, 1998. The disclosures of the prior applications are considered part of (and are incorporated by reference in) the disclosure of this application.

BACKGROUND OF THE INVENTION

1. Field of the Invention

The present invention relates to a method for producing structured electrodes and especially organic electraluminescent components with structured electrodes. The components are used in displays and the like and further comprise structured metal electrodes, The electrode is supported by multiple layers of varying widths and heights such that in combination with other supports, active organic layers may be tightly packed into a display area. A possible arrangement includes an electrode placed atop the active layers.

2. Description of Related Art

Thin layers, in particular those with a thickness of 1 nm to 10 $\mu$m, find diverse technological applications, for example: semiconductor production; and microelectronic, sensory and display technologies. Production of the organic electro-luminescent components usually includes structuring necessary layers; whereas the necessary structure sizes range from the sub-$\mu$-area to the entire substrate area. In addition, the required component form varieties are practically unlimited.

In general, there are many available lithographic processes available for structuring electrodes. What most of these processes have in common is that the layers to be structured come into contact with more or less caustic chemicals, including photoresists, solvents, developing fluids, and corrosive gases. Such contact can lead to corrosion or at least damage of the layers to be structured. This is often the case with organic light emitting diodes.

Organic Light Emitting Diodes (OLEDs), i.e. electro-luminescent diodes, are predominately used in displays. Examples of such applications are set out in U.S. Pat. Nos. 4,356,429 and 5,247,190. A method of producing electrodes in general is disclosed in German patent registration reference 197 45 610.3. The structure and production of OLED displays typically occurs as follows.

A substrate, for example glass, is coated entirely with a transparent electrode—bottom electrode, anode. The bottom electrode can comprise indium-tin-oxide (ITO). To produce pixel-matrix-displays, the transparent bottom electrode as well as the later formed top electrode (cathode), is structured. Accordingly, both electrodes are usually structured in the form of parallel strip conductors. The strip conductors of the bottom and top electrodes tend to run vertically with respect to each others. The structuring of the bottom electrode occurs via a photolithographic process which includes wet chemical etching methods, the details of which are known to one skilled in the art. The etched final structure obtainable with this method is essentially limited by the photolithographic steps and the consistency of the bottom electrode. According to the current state of the art, pixel sizes as well as non-emitting spaces between the pixels can be as small as a few micrometers. The lengths of the strip shaped strip conductors of the bottom electrode can be as large as many centimeters. According to current lithographic masking, emitting areas as large as several square centimeters can also be produced. The sequence of each emitting area can be regular (pixel-matrix-display) or variable (symbol presentations).

One or more organic layers are applied on a substrate, the substrate including the structured transparent bottom electrode. These organic layers may comprise polymers, oligomers, and low molecular combinations or mixtures thereof. To apply polymers, for example polyainilene, poly (p-phenylenevinylene) and poly (2-methoxy-5-(2'ethyl) hexyloxy-p-phenylenevinylene), generally liquid phase processes are used (application of a solution by spin coating or blading); while a gas phase deposition is preferred for low molecular and oligomer combinations (Evaporation or Physical Vapor Deposition, PVD). Examples of low molecular layers, such as positive charge transporting carriers include the following: N,N'-bis-(3-methylphenyl)-N,N'-bis-(phenyl)benzidine(m-TPD), 4,4',4"-Tris-(N-3-methylphenyl-N-phenylamino)-triphenylamine (m-MTDATA) and 4,4',4"-Tris-(carbazol-9-yl)-triphenylamine (TCTA). Hydroxychinoline-aluminium-III-salt (Alq) is used, for example as an emitter, which can be doped with suitable chromophores (quinacridone-derivates, aromatic hydrocarbons, etc.). If necessary, exemplary existing additional layers which influence the electro-optical characteristics as well as the long-term characteristics may be copper-phthalocyanine. The entire thickness of the layer sequence can range between 10 nm and 10 $\mu$m, typically in the range of 50 to 200 nm.

The top electrode usually comprises a metal which is generally applied by gas phase deposition (thermic deposition, sputtering or cathode rays deposition). Preferred compositions are base (therefore reactive metals, especially to water and oxygen), and include lithium, magnesium, aluminum and calcium as well as alloys of these metals. For the production of a pixel-matrix-order structure having metal electrodes, the structure is obtained generally by applying the metal through a mask opening.

A produced OLED-display, according to this method, may additionally contain electro-optical features such as: UV-filters, polarization filters, anti-reflection coatings, and (micro-cavities) known installations such as color conversion and color correctional filters. In addition, a hermetically-sealed packaging may be provided by which the organic electro-luminescent displays are protected from external environmental influences such as humidity and mechanical strains. Thin film transistors for individual picture elements (pixel) can be added.

For high resolution displays on which large informational content can be presented, a fine structuring of the metal electrodes in the form of strip conductors is necessary. For example the width of the strip conductors as well as the spacing in between must be structured in keeping with narrow tolerances in the microns. Herein, the width of a strip conductor can lie between 10 $\mu$m and several hundred micrometers, preferably between 100 and 300 $\mu$m. To reach a high filling factor (share of the active light emitting area versus the entire display area) it is also necessary that the spaces between the metallic strip conductors as well as the spaces between the strip conductors of the transparent bottom electrode be only a few micrometers. Established structuring techniques can not be used here because the existing active organic layers, i.e. the electro-luminescent materials, are not resistant to the necessary chemicals for such fine structuring.

By so called shadow masking, i.e. thin metals or segments with correspondingly formed openings for a desired structure, only layers can be structured and produced according to CVD or PVD (chemical vapor deposition, physical vapor deposition) methods. Furthermore, the obtainable resolution produces (based on the finite distance between masking and substrate) relatively inferior results and large areas (as a result of a bending of the shadow masking), cannot be realized in view of production engineering.

A lift off method for the production of structured metallizations by use of two separate photoresist layers is taught by German reference DE-A44 01 590 which produces relatively thick metal structures on semiconductor components.

Furthermore European reference EP-A-0 732 868 describes a method for the production of an organic electro-luminescent display device. For this, on a multiple number of first display electrodes, electrically insulated overhanging structures are produced, which are built up from a first layer, for example of polyamide, and a second layer of for example $SiO_2$. Afterwards, organic functional layers for different color components or an only color component are applied in the areas between the electrically insulated structures by use of (shadows) masks, then the material for the second display electrode is precipitated on the organic functional layers and the electrically insulated structures.

BRIEF SUMMARY OF THE INVENTION

It is an object of the invention to provide a generally applicable structuring technique for electrodes, i.e. a technique with minimal limitations regarding geometry (structure size, forms, areas) and production (CVD and PVD methods, solvent processes). In particular, the instant method allows for suitable mass production of structured electrodes in organic electro-luminescent components, and in particular of fine structured metallic top high resolution displays wherein the electrodes to be structured are not damaged by chemicals.

With the foregoing and other objectives in view, there is provided in accordance with the invention a method of producing structured electrodes for organic electro-luminescent displays, comprising the steps of: forming a first layer on a substrate, said first layer having a first width and a first solvent rate; forming a protective layer over said first layer; forming a second layer on said protective layer, said second layer having a second width and a second solvent rate; etching said first and second layer with at least one solvent such that said second width is greater than said first width; and forming an electrode on said second layer.

The present invention may further comprise a method of producing structured electrodes for organic electro-luminescent displays, comprising the steps of: first forming a bottom electrode on a semiconductor substrate, second forming a first layer on said bottom electrode, said first layer having a first width and a first solvent rate; third forming an electrically insulating protective layer over said first layer; fourth forming a second layer on said protective layer, said second layer having a second width and a second solvent rate; fifth etching said first and second layer with at least one solvent such that said second width is greater than said first width; sixth forming an organic active layer on said second layer; and seventh forming a top electrode on said second layer. The method can also be applied where only one solvent is used and said first and second layers are reactive to said one solvent.

A new method for a maskless production of structured electrodes, especially for organic electro-luminescent components, is provided. This method enables the production of structured metal electrodes, particularly for organic-electro-luminescent displays. By this method, structures can be produced which are suitable for wide area displays, well as the possibility of structuring of metal electrodes on electro-luminescent polymers. The instant method is also especially suitable for lithographic applications.

BRIEF DESCRIPTION OF THE DRAWING

The FIGURE depicts a schematic cross section of an example embodiment of an organic light emitting diode produced in accordance with the instant method.

DETAILED DESCRIPTION OF THE INVENTION

The diode according to the invention comprises a substrate 1, with a structured bottom electrode 2 layered thereon. The substrate 1 can be transparent. The substrate 1 can include a non-planar geometry of glass, metal, silicon or polymer (in the form of a foil). The bottom electrode 2 can include an ITO electrode (ITO=Indium Tin Oxide). Atop the bottom electrode 2, a first layer 3 is formed, the details of which are set out below. According to one embodiment, a protective layer is formed on first layer 3 (not shown). The protective layer may be electrically insulating and comprise any properties known to one skilled in the art to accomplish the same. Likewise, the protective layer may prevent intermixing, as discussed below, and further comprise any suitable materials for the same. Atop the protective layer, a second layer 4 is formed. Thereon, similarly to the embodiment shown in the FIGURE, an active organic layer 5 is formed and still further a top electrode 6. The top electrode may be a metal. As set out in more detail below, the first and second layers are formed such that the second layer overhangs the first layer. In the spaces between the above-described structure, a second active organic layer 5 and top electrode 6 can be formed, as shown in the FIGURE. The first and second active organic layers and top electrodes may be identical, different and/or related in composition and function. The height and width of the second formation is engineered to maximize exposure of the active organic layer, in the top direction, from between adjacent structured electrode formations or alongside at least one electrode formation.

In one embodiment of the instant method, two layers are applied on a bottom electrode, with the electrode positioned on a substrate. On the second of the two layers, (after structuring, structure transfer and cross linking) at least one active organic layer is applied. A top electrode is then deposited on the active organic functional layer.

The top electrode, which can be selected to exhibit low electron affinity, functions as an electron rejecting electrode, and comprises a metal or a metallic coating. In addition, this electrode may also include a layered arrangement, wherein on a thin dielectrical layer (<5 nm), which for example comprises lithiumfluoride or aluminiumoxide, a metal or ITO layer is placed as a (transparent) electrode.

According to the present inventive method, it is essential that the first layer applied on the bottom electrode, which can be a structured or applied layer, is not damaged by applying the second upper layer, and a defined boundary is maintained between both layers. The first and/or second layer preferably comprises an organic film forming material, such as a photoresist.

Photoresists are radiation sensitive film forming materials whose solubility changes with exposure to radiation. Herein, it is distinguished between use of positive and negative photoresists. When the upper and lower layers comprise a photoresist and each are sensitive to approximately the same radiation wavelength, the lower photoresist may not be a negative photoresist.

According to one embodiment of the present invention, wherein an essential characteristic of the embodiment includes a photolithographic process, at least two layers are selectively applied on a transparent bottom electrode, wherein the first layer comprises a resist or photoresist and the second layer comprises a positive or negative photoresist layer, and in the case where the first layer comprises a photoresist layer, the first layer will be exposed to radiation prior to the application of the second layer. The layers are then structured in such a way that the active organic layers and top electrodes may be respectively applied and/or deposited on the second layer. The layers are structured vertically with respect to the length of the bottom electrode. The application of the active organic layers on the second layer can generally occur by thermic deposition processes as well as by solvent applications, such as spinning or blading following drying.

At the photolithographic method step, the first of the two layers must be overcoatable or overcoated with a protective layer. This means that both layers can be applied on top of each other without a so called intermixing, i.e. applied layers are soluble in different solvents, such that the (photo) resist of the first layer is not affected by the solvent for the photoresist of the second layer. Accordingly, the applied first layer is preserved during application of the second layer. Likewise, a defined boundary is maintained between the two layers.

For the photolithographic method step it is also recommended, that the first layer has a higher developing rate than the second layer. As such, after the exposure, by the necessary structuring treatment of the photoresist layers, the first layer dissolves faster with a developing solvent than the second layer. It is advantageous if both layers can be treated i.e. developed, with the same developer, preferably a watery-alkaline developer.

In general, for the lower layer, electrical insulating organic and inorganic materials are used. Suitable inorganic materials include: silicondioxide; siliconnitrite; and aluminiumoxide. But the lower layer may for example also comprise an alkaline developable non-photo sensitive polyamide. It is advantageous if the lower layer is photosensitive and preferably comprises a positive photoresist on the basis of polyglutarimide or polybenzoxazol.

The upper layer is preferably also a photoresist. This layer comprises a positive photoresist (Positivresist) of a Novolak/Diazoquinone-basis or a negative photoresist (Negativresist) on the basis of Novolak/Cross-linker/photo acid. For the positiveresist polymethylmethacrylate (PMM) may be used, and as negativeresist an crosslinkable polysilphenylensiloxanes may be used.

However, it is also possible to indirectly structure the upper layer. An amorphous carbon (a-C) or amorphous hydrogen carbon (a-C:H) can serve as a coating material. Such layers are structured in an oxygen plasma, whereas a mask in the form of a silicon photoresist layer, particularly a so-called CARL-resist (CARL=Chemical Amplification of Resist Line) or a TSI system (TSI=Top Surface Imaging)is used for etching.

Following the above described method, a structure as shown in the figure is created, wherein the second, layer shows a larger structure width than the first layer (overhanging structure). The second layer, which consists preferably of a film forming organic material, is cross-linked, whereby the mechanical stability and the thermal resistance is enhanced. The overhanging structure will not be impaired by the cross-linking.

Based on the cross-linking, the overhanging of the second layer will be stabilized, so that larger areas, especially long borders, can be realized and the layer production can take place by solvent processes. The stable overhanging then produces the structure of the following applied layers because at the border of the overhanging by, CVD- or PVD as well as from liquid phase processes, applied layers are cut off and separated into different zones, i.e. structured. In particular, these are active organic layers, i.e. electro-luminescent layers, and electrodes.

As discussed above, the upper layer shows a wider structuring width after the structuring than the lower layer. The difference in the structuring width (overhanging) is preferably between 1 and 10 $\mu$m. Preferably, the thickness of the lower layer is 0.1 to 30 $\mu$m and in particular 0.5 to 10 $\mu$m, and the thickness of the upper layer 0.1 to 30 $\mu$m and in particular 0.5 to 5 m.

The following are two examples of implementing the above-described method.

EXAMPLE 1

Production of an OLED Display

The production of a display utilizes the following method steps:

1. An entire glass sheet is coated with indium-tin-oxide (ITO) and then structured according to a photolithographic method followed by wet chemical etching, in such a way that parallel conductor strips with a width of approximately 200 $\mu$m and a space of approximately 50 $\mu$m are formed. The photoresist used during structuring is then completely removed. The conductor strips are each approximately 2-cm long and include at their outer ends additions for external contacting if applicable.
2. The glass sheet is heated for approximately 1 hour at a temperature of 250° C., then a commercial photoresist on the basis of polyglutarimide is spun on (application for a duration of 10 seconds at 700 rotations/minute, then spun off for 30 seconds at 3000 rotations/minute). The obtained layer is dried for 15 minutes at 150° C. and then for 30 minutes at 250° C. in a circulating air oven. A streaming exposure at a wavelength of 248 nm (polychromatic) with a dose of 100 mJ/cm$^2$ is created afterwards. Then a commercial photoresist on the basis of Novolak/Diazoquinone (10:1 diluted with (1-methoxy-2-propyl) acetate) is spun on at 2000 rotations/minute for 20 seconds. Both layers are dried for 60 seconds at 100° C., and afterwards exposed to a radiation dose of 62 mJ/cm$^2$ at a wavelength of 365 nm (polychromatic) via lithographic masking. Then with a commercial developer which contains tetramethylammonium hydroxide, the structure is developed for 20 seconds. Subsequently, the glass sheet is put into a 100° C. preheated air circulating oven and annealed for 45 minutes at 230° C.; thereby cross-linking the upper photoresist. Then the described developer develops twice more for 70 seconds; thereby an over-hanging of the upper layer of approximately 5 $\mu$m is created. The layer thickness of the lower layer is approximately 2.6 $\mu$m; both layers together are approximately 4.3 $\mu$m thick. Subsequently, resist remnants are removed for 90 seconds from the ITO surface by oxygen plasma (RF capacity: 70 W, gas flux: 30 sccm).
3. At a pressure of $10^{-5}$ mbar, a layer of N,N'-(3-methylephenyle)-N,N'-(phenyl)-benzidin (m-TPD) is applied by conventional vapor deposition (layer thickness: 135 nm, deposition rate: 0.2 nm/s).
4. Without the use of a mask, a 100 nm thick layer of magnesium is applied on the active surface of the display by thermic deposition (deposition rate: 1 nm/s, pressure: $10^{-5}$ mbar). Without interrupting the vacuum, a 100 nm thick layer of silver is applied, also by vapor deposition, on the active display area (deposition rate: 1 nm/s, pressure: $10^{-5}$ mbar). The resulting display flashes are clearly visible in the day light and the emission color is greenish-yellow.

EXAMPLE 2

Production of an OLED Display

A 1% solvent of an electro-luminescent polymer on the basis of fluorines in Xylole is spun on (4000 rotations/min, 30 s) a glass sheet with a produced layer build up corresponding to example 1. Subsequently, it is dried for 60 seconds at 85° C. Without the use of masking, a 100 nm thick layer of calcium is applied on the active area of the display by vapor deposition (deposition rate: 1 nm/s, pressure: $10^{-5}$ mbar). Without interrupting the vacuum, a 100 nm thick layer of silver is also applied on the active display area by vapor deposition (deposition rate; 1 nm/s, pressure: $10^{-5}$ mbar).

The display flashes are clearly visible in the day light and the emission color is greenish-yellow. The invention being thus described, it will be obvious that the same may be varied in many ways. Such variations are not to be regarded as a departure from the spirit and scope of the invention, and all such modifications would be obvious to one skilled in the art intended to be included within the scope of the following claims.

I claim:

1. An organic electroluminescent display, comprising:
a substrate;
a first electrode layer supported by the substrate;
a first layer supported by the substrate;
a second layer supported by the first layer, the second layer including a cross-linked material, wherein the first layer has a first width and the second layer has a second width that is greater than the first width and the first and the second layers together form a structure;
an organic active layer supported by the first electrode layer; and
a second electrode layer having a first portion and a second portion, wherein the first portion has two or more electrodes, the structure formed by the first and second layers separates a first electrode of the two or more electrodes from a second electrode of the two or more electrodes and the second electrode layer has a second portion that is supported by the structure, the structure including an overhang that prevents the two or more electrodes from electrically contacting the second portion of the second electrode layer.

2. The display of claim 1, wherein:
the first layer is supported by the first electrode layer.
3. The display of claim 1, wherein:
the first layer has a higher solubility rate in a liquid developer than the second layer.
4. The display of claim 1, wherein:
the first layer includes a photoresist.
5. The display of claim 1, wherein:
the second layer includes a photoresist.
6. The display of claim 1, wherein:
the first layer includes a positive photoresist.
7. The display of claim 1, wherein:
the positive photoresist includes polyglutarimide.
8. The display of claim 6, wherein:
the positive photoresist includes polybenzoxazole.
9. The display of claim 1, wherein:
the second layer includes a positive photoresist.
10. The display of claim 9, wherein:
the positive photoresist includes polyglutarimide.
11. The display of claim 9, wherein:
the positive photoresist includes polybenzoxazole.
12. The display of claim 11, wherein:
the positive photoresist includes novalak.
13. The display of claim 12, wherein:
the positive photoresist includes a mixture of novalak and diazoquinone.
14. The display of claim 11, wherein:
the positive photoresist includes diazoquinone.
15. The display of claim 1, wherein:
the second layer includes a negative photoresist.
16. The display of claim 15, wherein:
the negative photoresist includes novalak.
17. The display of claim 15, wherein:
the negative photoresist includes a crosslinker.
18. The display of claim 15, wherein:
the negative photoresist includes a photoacid.
19. The display of claim 15, wherein:
the negative photoresist includes at least two materials from the group consisting of novalak, a crosslinker and a photoacid.
20. The display of claim 1, wherein:
the structure formed by the first and second layers separates the organic active layer into first and second portions.
21. The display of claim 1, wherein:
the organic active layer is formed by vapor deposition.
22. The display of claim 1, wherein:
the organic active layer is formed by a liquid phase process.

* * * * *

UNITED STATES PATENT AND TRADEMARK OFFICE
CERTIFICATE OF CORRECTION

PATENT NO. : 6,885,150 B2 Page 1 of 1
DATED : April 26, 2005
INVENTOR(S) : Ewald Karl Michael Guenther It is certified that error appears in the above-identified patent and that said Letters Patent is hereby corrected as shown below:

<u>Column 8,</u>
Line 16, please replace "1" with -- 6 --.

Signed and Sealed this

Twentieth Day of September, 2005

JON W. DUDAS
*Director of the United States Patent and Trademark Office*